(12) United States Patent
Kuttner

(10) Patent No.: US 7,342,530 B2
(45) Date of Patent: Mar. 11, 2008

(54) SUCCESSIVE APPROXIMATION ANALOG/DIGITAL CONVERTER

(75) Inventor: Franz Kuttner, St. Ulrich (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/477,308

(22) Filed: Jun. 29, 2006

(65) Prior Publication Data

US 2007/0001892 A1 Jan. 4, 2007

(30) Foreign Application Priority Data

Jun. 30, 2005 (DE) .................... 10 2005 030 562

(51) Int. Cl.
*H03M 1/34* (2006.01)

(52) U.S. Cl. ...................... 341/163; 341/155

(58) Field of Classification Search ................ 341/155, 341/172, 143, 163
See application file for complete search history.

(56) References Cited

U.S. PATENT DOCUMENTS

| | | | | |
|---|---|---|---|---|
| 5,138,319 | A | | 8/1992 | Tesch .......................... 341/156 |
| 5,581,252 | A | | 12/1996 | Thomas ....................... 341/144 |
| 5,726,654 | A | * | 3/1998 | Hatae et al. ................. 341/161 |
| 5,825,316 | A | * | 10/1998 | Kuttner ....................... 341/120 |
| 5,920,275 | A | | 7/1999 | Hester ......................... 341/172 |
| 5,949,156 | A | * | 9/1999 | Groover ...................... 307/109 |
| 6,583,745 | B2 | | 6/2003 | Sakakibara et al. ......... 341/155 |
| 7,023,372 | B1 | * | 4/2006 | Singh et al. ................. 341/155 |
| 7,180,354 | B2 | * | 2/2007 | Gabillard et al. ........... 327/307 |

FOREIGN PATENT DOCUMENTS

| | | |
|---|---|---|
| DE | 100 52 944 C2 | 10/2000 |
| DE | 101 39 488 C1 | 8/2001 |
| EP | 1 093 229 A2 | 4/2001 |

OTHER PUBLICATIONS

German Office Action dated Mar. 22, 2006.

* cited by examiner

*Primary Examiner*—Peguy JeanPierre
(74) *Attorney, Agent, or Firm*—Jenkins, Wilson, Taylor & Hunt, P.A.

(57) ABSTRACT

A successive approximation analog/digital converter converting an analog input signal into a digital output value by means of a plurality of successive conversion cycles, comprises at least one first input for injecting an analog input signal, a controllable capacitive network which is connected downstream of the first input and which is divided into at least two capacitive subnetworks and, at least two parallel-connected and parallel-operating comparators for defining a number of comparator thresholds which corresponds to the number of parallel comparators. The comparators are respectively connected downstream of one of the capacitive subnetworks and the comparators output a corresponding number of digital intermediate signals on the basis of the comparisons in the comparators. The analog/digital converter further comprises a register set by the intermediate signals. The register buffer-stores digital intermediate values for the respective intermediate signals and produces control signals for actuating the capacitive subnetworks in response to the content of the intermediate signals.

15 Claims, 5 Drawing Sheets

SUCCESSIVE APPROXIMATION ANALOG/DIGITAL CONVERTER

BACKGROUND OF THE INVENTION

The present invention relates to an analog/digital converter.

Analog/digital converters—frequently also called A/D converters—are electronic circuits which convert an analog input variable, for example an input voltage or an input current, into a proportional digital output variable, which are able to be output as a binary thermometer code encoded output signal, for example. Many kinds of A/D converter types are known for analog/digital conversion, for example parallel operation A/D converters (flash converters), cascade A/D converters (subranging converters), and A/D converters operating on the basis of the weighing process or the principle of successive approximation (in this regard see Tietze, Schenk, Halbleiterschaltungstechnik [Semiconductor circuitry], 10th edition, particularly pages 780 ff).

The process of successive approximation involves the data bits of a digital output variable being determined successively one after the other from an input variable in weighing steps. FIG. 4 shows the basic design of a successive approximation A/D converter 1 described, for example, in German patent DE 101 39 488 C1. The A/D converter 1 has a sample and hold circuit 2 (hold and track circuit) on its input for the purpose of sampling and storing an analog input signal UE. The sample and hold circuit 2 buffer-stores the input signal UE in order to ensure that changes in the input signal UE cause no errors during the conversion period. In addition, a comparator 3 is provided for comparing the stored analog input signal UE with the analog intermediate signal UZ derived from the digital output signal UD. The analog intermediate signal UZ is obtained by feeding back the digital output signal UD produced by an SAR register 4 (SAR=Successive Approximation Register) and subsequent digital/analog conversion. For this, an n-bit D/A converter 5 is provided, with n denoting the resolution of the D/A conversion in this case.

During the successive approximation, the most significant bit (MSB) is set first of all and then the digital/analog converter is used to ascertain the associated value of an analog voltage. If the input analog voltage UE to be converted is larger than the ascertained output analog voltage UZ from the digital/analog converter then the set bit remains set. In the opposite case, it is reset again. The next least significant bit is then determined in the same way. In this way, the process is continued until all the bits of the digital/analog converter have been ascertained successively.

The maximum conversion speed of the A/D converter 1 shown in FIG. 4 is determined by virtue of the n-bit A/D converter needing to make n decisions. In such A/D converters, the conversion rate is dependent primarily on the speed of the comparator 3. The speed of the comparator 3 is determined essentially by its recovery time after the linear input stage has been overdriven and secondly by the minimum switching time of the comparator 3 at a low drive level. Since the data bits of the digitally converted value are ascertained successively from the analog input signal, the conversion rate is much lower in comparison with a parallel converter or a cascade converter. A speed increase or an increase in the conversion rate for successive approximation analog/digital converters is therefore particularly desirable.

To increase the converter speed, A/D converters using a conversion algorithm with redundancy or with redundant code are therefore being used to an increasing extent. These A/D converters, which are subsequently also called redundant A/D converters for short, involve each conversion step permitting a greater or lesser error. FIG. 5 shows a redundant A/D converter of this kind, described in German patent DE 101 39 488 C1, for example. In this case, the redundant A/D converter 100 has a capacitive network 110 with a large number of individual reference capacitances 120. The individual reference capacitances 110 in this arrangement have a respective prescribed weighting such that the capacitive network 110 is thereby encoded with a redundant code. Either an analog input voltage UE or a reference voltage UREF for producing a comparison voltage can be applied to these reference capacitances 120 via respective controllable switches 130. The reference capacitances 120 together with the controllable switches 130 have the function of a D/A converter. The A/D converter 100 also has a separate comparator 140 whose inputs 150 are used to inject firstly the input voltage UE and secondly the comparison voltage produced from the reference voltage UREF, these being compared in the comparator 140. The comparator 140 can also be bridged by means of controllable switches 160 in order to sample and store the input voltage UE at the start of a conversion. The comparator 140 forwards the result from the comparison to an SAR register 170 which, on the basis of the instantaneous comparison result, actuates and selects the reference capacitances 120 in the capacitive network 110 for the subsequent comparison such that a gradual approximation, that is to say a successive approximation, to the actual input voltage UE is achieved. The comparison and gradual approximation are carried out down to the least significant bit (LSB). At the end of a conversion cycle of this kind, the SAR register 170 outputs the ascertained digital value UD, which is thus encoded with the redundant code from the capacitive network 110, to an adder 18. The adder 180 uses addition to correct the ascertained redundant code from the digital signal UD using the values stored in a memory 190 for the reference capacitances 120 and outputs the digital, for example binary encoded, output signal UD' obtained in this way.

Nevertheless, the conversion speed and hence the conversion time for converting an analog input value into a digital output value cannot be shortened arbitrarily in the case of a successive approximation A/D converter. The reason for this, inter alia, is that the comparator can make only a single decision per conversion cycle.

Another aspect is the power loss in an A/D converter: if one considers the power loss in a successive approximation A/D converter, one finds that the majority of the power loss is consumed in its input driver (approximately 80% of the power loss), which thus needs to load the capacitances in the capacitive network, while the smaller component of the power loss is produced in the actual comparator in the A/D converter (approximately 20% of the power loss). The reason for this is that an A/D converter's input driver needs to operate as linearly as possible, whereas linearity plays a minor role in the actual comparator. Added to this is the fact that in a successive approximation A/D converter the influence of parasitic capacitances is very much greater at the input than is the case on the comparator. The result of this is that the input driver needs to drive very many more parasitic capacitances than the actual comparator.

In summary, it can therefore be stated that a successive approximation A/D converter has a relatively low conversion speed in comparison with other A/D converters. In addition, its power loss is also relatively high on account of the influence of the input drivers. A similarly disadvantageous characteristic is the need for the input driver to be given relatively large proportions on account of the great influence of parasitic capacitances on the input side.

To eliminate these drawbacks, it would admittedly be possible to use a cascade converter, which provides comparatively faster analog/digital conversion and also has a lower power loss on account of the larger number of comparators. However, a cascade converter has an unfavorable characteristic, particularly when using a multistage cascade converter and an associated large number of input capacitances, since the noise requirements in the case of a cascade converter require a very high level of capacity to be provided for every single input capacitance, and this complexity can increase the associated complexity exorbitantly, particularly with a large number of input capacitances.

BRIEF SUMMARY OF THE INVENTION

A successive approximation analog/digital converter is provided in which an analog input variable is converted into a digital output value in a plurality of successive conversion cycles, comprising at least one first input for injecting an analog input signal, comprising a controllable capacitive network which is connected downstream of the first input and which is divided into at least two capacitive subnetworks, comprising at least two parallel-connected and parallel-operating comparators for defining a number of comparator thresholds which corresponds to the number of parallel comparators, which are respectively connected downstream of one of the capacitive subnetworks and which output a corresponding number of digital intermediate signals on the basis of the comparisons in the comparators, comprising a register which can be set by the intermediate signals, which buffer-stores digital intermediate values for the respective intermediate signals and which takes the content of the ascertained intermediate signals as a basis for producing control signals for actuating the capacitive subnetworks.

The idea on which the present invention is based is to provide a successively operating A/D converter with more than just one comparator. These comparators are comparators which are connected in parallel with one another and are therefore designed to operate in parallel with one another too and hence to perform a respective conversion in parallel. These parallel-connected and parallel-operating comparators are used to define a number of comparator thresholds which corresponds to the number of these comparators. For this, the capacitive network of the A/D converter needs to be accordingly divided into a plurality of capacitive subnetworks. The particular advantage here is that the use of a plurality of comparators allows the overall A/D conversion to be made faster without this having significant drawbacks in terms of power loss, since the proportion of the power loss in the comparator relative to the capacitive network turns out to be very small.

Unlike previously known successive approximation A/D converters, the inventive successive approximation A/D converter requires a smaller number of conversion cycles for ascertaining the converter result, since a larger number of comparators is available for this ascertainment of the converter result. Since more than one bit of the output signal can therefore be determined per conversion cycle, the conversion rate of the inventive A/D converter is significantly faster than in the case of previously known successive approximation A/D converters.

In one particularly preferred embodiment of the inventive A/D converter, at least one first controllable switch is provided which can be used to short two capacitive subnetworks and hence the inputs of the relevant comparators, respectively. Preferably, a control circuit is also provided. The control circuit actuates the first controllable switches by producing a further control signal, which can be used to short at least two of the capacitive subnetworks following the conclusion of the analog/digital conversion and to read the total charge of the thus shorted capacitive subnetworks via the comparators.

These measures allow the thermal noise caused by the switch resistance as a result of the switching of the capacitive elements in the capacitive network, said noise being dependent firstly on the total capacitance of the capacitive network, on the Boltzmann constant and on the temperature, to be ascertained at the end of a conversion, to be evaluated and to be taken into account for the digital output signal, for example by correcting the digital output signal in appropriate fashion.

A respective comparator may be designed to compare the analog input signal with the comparison signal in order to determine the range defined by the comparator thresholds which contains the analog input signal. On the basis of this, a digital intermediate signal can be output per comparator and conversion cycle.

At least one comparator may have at least one second controllable switch which can be used to bridge its inputs and outputs for the start of an analog/digital conversion, for example.

In one embodiment, a multistage comparator arrangement is provided. In this case, a first comparator stage comprises at least two comparators which are connected to the capacitive network. A second comparator stage has the inputs of its comparators connected to at least one comparator in the comparator stage which is respectively connected upstream of the further comparator stage.

The second comparator stage may also have a larger number of comparators than the respective upstream comparator stage. In this arrangement, the comparators in the second comparator stage are logically combined at least to some extent through interpolation with the comparators in the respective upstream comparator stage, which allows a larger number of comparator thresholds and hence faster analog/digital conversion to be provided.

Arranging the comparators in the plurality of comparator stages and increasing the number of thresholds through interpolation of adjacent comparators are advantageous because this makes the speed of the comparator arrangement faster and means that it requires less power and the A/D converter therefore becomes more efficient overall. In the prior art, this technology, i.e. increasing the number of thresholds through a multistage comparator arrangement and through interpolation of adjacent comparators, is used only for cascade converters and for parallel operation A/D converters. For successive approximation A/D converters, this technology has not been relevant to date merely for the reason that the use of a large number of comparators was not considered therein.

The capacitive network may have a multiplicity of switchable encoded capacitances which can be switched in or out by means of a respective encoded control signal, which is provided by the logic circuit or the register arranged therein, for example.

In one embodiment of the inventive analog/digital converter, the switchable capacitances in the capacitive network are arranged in a cell array which is divided into precisely three adjacent capacitive subnetworks. In this arrangement, each of these capacitive subnetworks is respectively coupled to a downstream comparator in the first comparator stage. To actuate the three capacitive subnetworks, just two column decoders (or else row decoders) are provided which are respectively connected directly to two of the capacitive subnetworks. In this case, the respective third capacitive subnetwork is actuated by the two column decoders (or else row decoders) by averaging the control signals for these two column decoders (or else row decoders).

The register may be in the form of a successive approximation register, but any other, nonbinary, register could also be provided here.

Besides the first inputs, the inventive analog/digital converter may also comprise at least one second input for injecting a reference signal which is used at the start of the analog/digital conversion as a reference for the conversion.

The inventive analog/digital converter and, in this context, particularly the comparator arrangement and the capacitive network and also a possibly provided input stage may be of fully differential design.

The inventive analog/digital converter may be in the form of a 'redundant analog/digital converter', which is advantageous particularly in terms of a higher converter speed.

BRIEF DESCRIPTION OF THE SEVERAL VIEWS OF THE DRAWINGS

The invention is explained in more detail below using the exemplary embodiments which are indicated in the schematic figures in the drawing, in which.

DETAILED DESCRIPTION OF THE INVENTION

Figure 1:
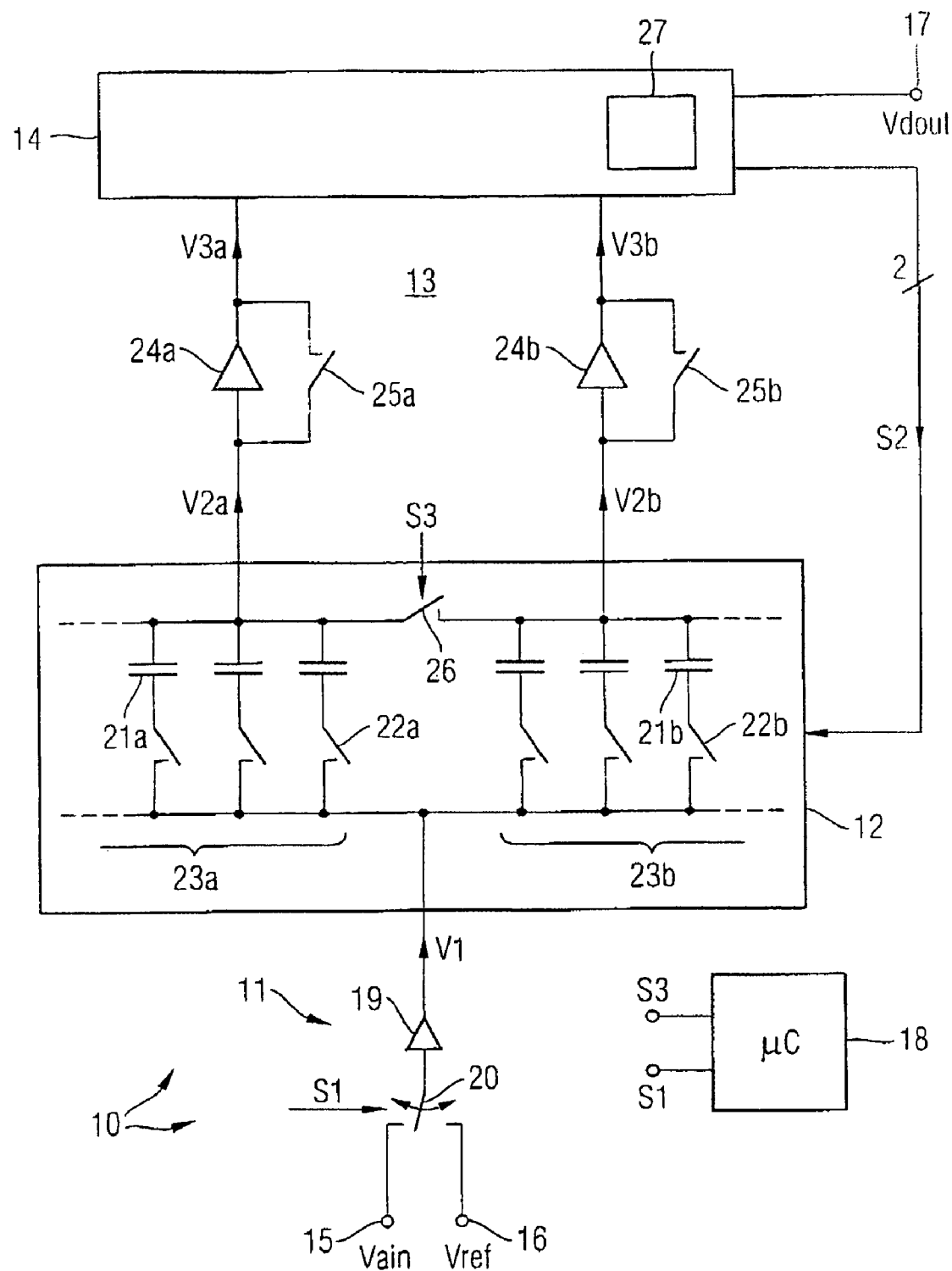
FIG. 1 is a block diagram of a first general exemplary embodiment of an inventive successive approximation A/D converter.

In the figures of the drawing, elements, features and signals which are the same or have the same function have been provided with the same reference symbols—unless stated otherwise.

FIG. 1 shows a block diagram of a first general exemplary embodiment of an inventive successive approximation A/D converter.

The A/D converter in FIG. 1 is denoted by reference symbol 10. In FIG. 1, the A/D converter 10 shown therein is first of all shown in nondifferential form, but this could very easily also be shown in differential form.

The A/D converter 10 essentially has an input buffer circuit 11, a capacitive network 12, a comparator stage 13 and a logic circuit 14. These circuit parts 11-14 of the A/D converter 10 are arranged between inputs 15, 16 and an output 17. In addition, a control device 18 is provided which can be used to control the function of the A/D converter 10.

A first input 15 can have the analog input signal Vain which is to be converted into a digital signal applied to it. The input signal Vain may have the form of a voltage signal or may be derived from a current signal using a resistor (not shown in FIG. 1). The second input 16 has a reference signal Vref, for example a reference voltage, applied to it. The inputs 15, 16 have the input buffer circuit 11 connected downstream of them. In addition, a controllable switch 20 is provided between the inputs 15, 16 and the input buffer circuit 11. The controllable switch 20 is designed to connect the input side of the input buffer circuit 11 to a respective one of the inputs 15, 16 and hence to apply a respective one of the signals Vain, Vref to it. In this case, the controllable switch 20 can be switched under clock control using an internal or external clock signal (not shown in FIG. 1) or said switching can be controlled by means of a control signal S1 from the control device 18.

The control device 18 may be in arbitrary form. Preferably, the control device 18 is be in the form of a program-controlled device, for example in the form of a hardwired logic circuit, such as an FPGA or PLD circuit, which is part of the A/D converter. It would naturally also be conceivable for the control device 18 to be in the form of a microcontroller or microcomputer controlling the manner of operation of the A/D converter. In this case, the A/D converter may also be part of the microcontroller, for example.

The output side of the input buffer circuit 11 produces an amplified signal V1 which respectively represents one of the signals Vain, Vref applied to the input side in amplified form on the basis of the switch position of the controllable switch 20. The output side of the input buffer circuit 11 has the capacitive network 12 connected downstream of it, to which the amplified signal V1 can thus be supplied.

Instead of the switch 20, two buffers for amplifying the signals Vain, Vref applied to the input side may also be used in principle. The switching function of the switch 20 could then be implemented using additional circuit complexity for the controllable switches 22a, 22b in the capacitive network 12.

The capacitive network 12 can be controlled by means of control signals S2 which—as will be presented below—are provided by the logic circuit 14. The capacitive network 12 has a multiplicity of switchable capacitances 21a, 21b; 22a, 22b. A respective switchable capacitance 21a, 21b; 22a, 22b in this arrangement has a capacitive element 21a, 21b, these being arranged in series with a respective controllable switch 22a, 22b. In this case, the controllable switches 22a, 22b can be controlled by means of the control signals S2.

In the present exemplary embodiment, the capacitive network 12 is of two-part design, with a first capacitive subnetwork 23a having just a portion of the capacitances 21a and also associated controllable switches 22a and a second capacitive subnetwork 23b having the respective other capacitances 21b and associated controllable switches 22b. The association between the controllable switches 22a, 22b and capacitive elements 21a, 21b and the respective capacitive subnetworks 23a, 23b is indicated in FIG. 1 by the letter a or b respectively.

In this context, the capacitive network 12 with the switchable capacitances 21a, 21b has the function of a digital/analog converter and of a sample and hold circuit, which is typically inherent to a successive approximation A/D converter.

There is also a further controllable switch 26 provided which shorts the outputs of the two capacitive subnetworks 23a, 23b. This controllable switch 26, which can be actuated by means of a control signal S3 from the control device, can therefore likewise be used to short the inputs of the downstream comparators 24a, 24b.

The output side of the capacitive network 12 has the comparator stage 13 connected downstream of it. In the present exemplary embodiment, the comparator stage 13 has two comparators 24a, 24b arranged in parallel with one another. Each of these comparators 24a, 24b is associated with and connected downstream of one of the two capacitive subnetworks 23a, 23b. Each comparator 24a, 24b may also have a controllable switch 25a, 25b via which the respective comparator 24a, 24b can be bridged in order to sample and store the input voltage signal Vain at the start of an A/D conversion.

The comparator stage 13 has the logic circuit 14 connected downstream of it which has at least one register 27 for storing the bits obtained with the two comparators 24a, 24b. In the case of a successive approximation A/D converter, this register 27 is typically a successive approximation register 27, subsequently called SAR register for short. The SAR register is used to store the respective comparison results from the two comparators 24a, 24b. Depending on the result of a respective instantaneous comparison in the comparators 24a, 24b, the SAR register 27 produces two control signals S2 for actuating the two capacitive subnetworks 23a, 23b or the respective controllable switches 22a, 22b associated with these subnetworks 23a, 23b.

The logic circuit 14 may contain an SAR register, which is specific to binary A/D converters 10. Additionally or alternatively, however, any form of the register 27 may be provided here. By way of example, the logic circuit 14 may contain any conversion algorithm for ascertaining the bits of the digital output signal Vdout. In particular, the logic circuit 14 may also be designed for any nonbinary operating A/D converter 10. It is particularly advantageous if the inventive A/D converter 10 is designed to have redundancy, which is advantageous particularly with regard to the speed of the A/D converter 10.

In the text below, however, the design and manner of operation of such a successive approximation A/D converter with redundancy is not discussed in more detail. By way of example, an A/D converter of this kind is described in detail in German patent application DE 101 39 488 C1, already mentioned at the outset. The full content of this document in terms of the design and manner of operation of an A/D converter with redundancy, as described therein with reference to FIG. 6, is incorporated into the present patent application.

The text below gives a more detailed explanation of the manner of operation of the inventive A/D converter 10 from FIG. 1 and particularly of the comparator stage 13 contained of the two comparators 24a, 24b.

In the inventive process for successive approximation, the data bits of the digital output signal Vdout are determined successively one after the other in weighing steps on the basis of the resolution of the analog/digital converter 10.

The two comparators 24a, 24b are designed to compare the input voltage Vain and the reference voltage Vref with one another. In this case, the two comparators 24a, 24b can be bridged by means of the controllable switches 25a, 25b in order to sample and store the input voltage Vain at the start of a conversion. In each conversion cycle, the two comparators 24a, 24b are used to determine two thresholds and hence three ranges which need to contain the input voltage Vain which is to be analyzed. In a subsequent conversion cycle, the two thresholds are then set by the two comparators 24a, 24b such that one of the three ranges is examined which contained the input voltage in the preceding conversion cycle. The result of the comparison is forwarded to the register 27. The output side of the register 27 produces digital control signals S2 in the form of a thermometer code, for example, which are used to actuate and select the capacitances 21a, 21b in the capacitive network 12 for the next comparison, on the basis of the instantaneous comparison result which has just been ascertained, such that a gradual approximation (successive approximation) to the actual input voltage Vain is achieved. This comparison and gradual approximation are carried out down to the least significant bits (LSBs). Once the result of the conversion has been reached, the register 27 forwards the ascertained and stored digital value as output signal Vdout.

In the case of an A/D converter 10 with redundancy, the digital value ascertained in this manner is encoded using a redundant code. This redundant code is obtained from values of the capacitances 21a, 21b, which have a firmly prescribed weighting. The ascertained digital value in the register 27 is then forwarded to an adder (not shown in FIG. 1) in which a correction for the ascertained value is ascertained with the redundant code from the capacitance values in the capacitive network. This produces a digital value minus redundancy which can be tapped off at the output 17 as a digital binary output signal Vdout. This digital output value Vdout corresponds in digital form to the analog value of the analog input signal Vain.

At the end of the conversion, the controllable switch 26 is closed by means of the control signal S3, which shorts the inputs of the two comparators 25a, 25b to one another. By shorting the inputs of the comparators 25a, 25b, it is possible to ascertain and evaluate the total charge in the capacitive network 12, that is to say in the two subnetworks 23a, 23b. This allows thermal noise, which is caused by the individual capacitances in this capacitive network 12, to be determined by virtue of all the capacitances 21a, 21b being connected in parallel with one another as a result of closure of the switch 26 and hence being able to be evaluated using the two comparators 24a, 24b. This noise signal can then also be taken into account for determining the result, that is to say the digital output signal Vdout.

Figure 2:
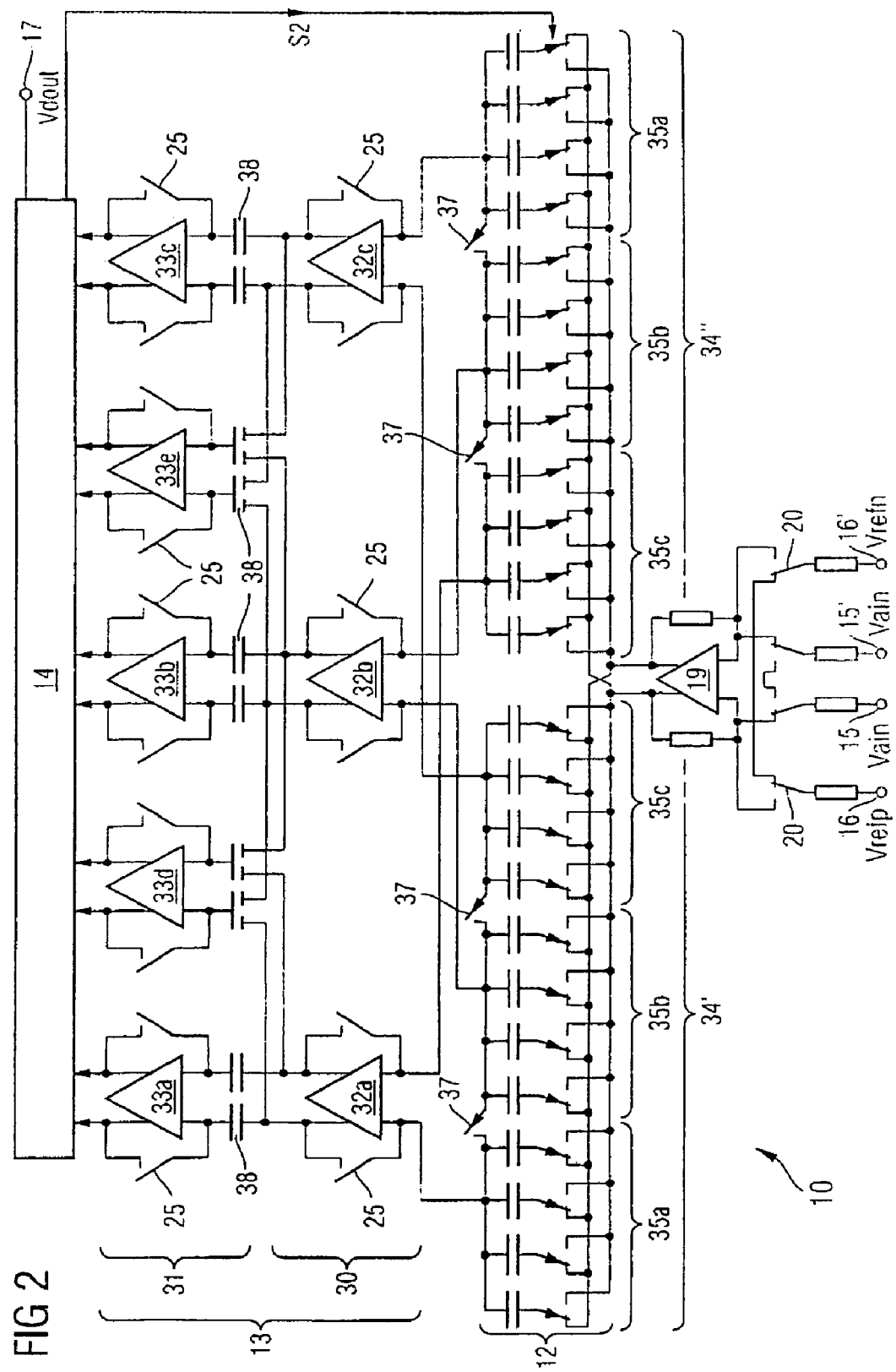
FIG. 2 is a block diagram of a second exemplary embodiment of an inventive successive approximation A/D converter.

FIG. 2 shows a block diagram of a second, particularly preferred exemplary embodiment of an inventive successive approximation A/D converter.

Unlike the exemplary embodiment in FIG. 1, the A/D converter in FIG. 2 is of fully differential design, that is to say that all the parts 11-14 of the A/D converter 10 are in differential form. The differential form has the advantage that the A/D converter is less sensitive to interference, which means that the digital output signal can be output at higher accuracy, which is particularly advantageous particularly in the case of high resolution A/D converters with a large bit width.

In the differential form, the A/D converter has two differential inputs 15, 15' which can be used to inject the input signal Vain. In addition, two differential reference inputs 16, 16' are provided which have differential reference signals Vrefp, Vrefn applied to them.

The amplifier 19 in the input buffer circuit respectively has two inputs and two outputs, so that depending on the position of the switches 20 either the input signal Vain or the differential reference signals Vrefp, Vrefn can be respectively applied to the inputs. In the same way, the capacitive network 12 and the comparator arrangement 13 are also of differential design. In this case, particularly the individual comparators in the comparator arrangement 13 are of differential design and thus have differential inputs and outputs.

Another difference between the exemplary embodiment in FIG. 2 and that in FIG. 2 is the form and the number of the comparators in the comparator arrangement 13. Whereas FIG. 1 has just two comparators 24a, 24b arranged in parallel with one another, the A/D converter 10 in FIG. 2 has two successively arranged comparator stages 30, 31. The first comparator stage 30, which is connected directly downstream of the capacitive network 12, has three comparators 32a-32c arranged in parallel with one another. The second comparator stage 31 has a total of five comparator stages 33a-33e arranged in parallel with one another. Each of the comparators 32a-32c; 33a-33e in the two comparator stages 30, 31 has two respective controllable switches 25 which can be used to short a respective one of the differential inputs of a comparator 32a-32c; 33a-33e of this kind to the respectively associated differential output of this comparator 32a-32c; 33a-33e for said comparator's operation for sampling the input signal at the start of the conversion.

The comparators 32a-32c in the first comparator stage 30 are designed to stipulate a total of three thresholds within which the input voltage must lie. Each of these comparators 32a-32c in the first comparator stage 30 has a second comparator 33a-33c in the second comparator stage 31 connected downstream of it, in each case directly. The two other comparators 32d, 32e in the second comparator stage 31 are arranged between respective adjacent comparators 33a-33c. The intermediate comparators 33d, 33e respectively arranged between these adjacent comparators 33a, 33b, 33c more or less average the output signals from adjacent comparators in the first comparator stage 30. This makes it possible to increase the number of thresholds for the second comparator stage 31 within which the input voltage must lie through interpolation, so that a total of five thresholds can be implemented by the two-stage comparator arrangement 30, 31. The five thresholds provided by the second comparator stage 31 thus allow a total of six ranges to be determined within which the input voltage Vain must lie.

In the example in FIG. 2, the capacitive network 12 is divided into a plurality of capacitive subnetworks. The fully differential arrangement first produces two capacitive subnetworks 34', 34" which are respectively associated with one of the outputs of the upstream amplifier 19. Each of these capacitive subnetworks 34', 34" is secondly divided into three further capacitive subnetworks 35a-35c, according to the number of comparators 32a-32c in the first comparator stage 30. These respective capacitive subnetworks 35a-35c are respectively arranged in parallel with one another and can be shorted using a respective controllable switch 37 which is arranged at the output of these capacitive subnetworks 35a-35c. In this way, the respective inputs of the respective downstream comparators 32a-32c in the first comparator stage 30 can be shorted to one another, so that in this case too the content of a respective subnetwork 34', 34" can be read via the comparators 32a-32c whose inputs are shorted, and hence can be evaluated, at the end of a conversion.

The respective comparators 32a-32c; 33a-33e in the first comparator stage 30 and the second comparator stage 31 have a respective capacitance 38 provided between them which is connected upstream of the respective inputs of the comparators 33a-33e in the second comparator stage 31. These capacitances 38 are used to store the voltage signal applied to the input side and to hold this voltage signal until the next comparison in the respective comparator 33a-33e.

As in the example in FIG. 1, the A/D converter 10 in the exemplary embodiment in FIG. 2 may also be produced with redundancy or else without redundancy in similar fashion. In principle, any desired conversion algorithm would be conceivable here.

The A/D converter 10 in FIG. 2 works in similar fashion to the A/D converter in FIG. 1, with in this case not two thresholds and three ranges for the input signal Vain but rather a total of five thresholds and hence six ranges which must contain the input signal Vain being determined. In this case, the first comparator stage 30 determines three thresholds and, through interpolation of these three thresholds in the second comparator stage 31, two further thresholds, that is to say a total of five thresholds. In this way, the two-stage comparator arrangement can determine a total of five bits of the output signal for each comparison and store them in the register 27 in the logic circuit 14. The logic circuit 14 or the register 27 uses its feedback path to produce a total of three control signals S2 in the thermometer code, these being used to reset the respective three subnetworks 35a-35c; 36a-36c in line with the value ascertained at the output of the comparator arrangement. In the next conversion cycle, the five thresholds are then set by the comparator arrangement 30, 31 such that one of the six ranges which have been determined in the preceding conversion cycle is now examined in order to ascertain the input voltage Vain.

At the end of the conversion, the inputs of the comparators 32a-32c in the first comparator stage 30 are shorted using the controllable switches 37, so that the total charge of the capacitive network 12 can be determined using the comparators of the in the comparator stages 30, 31. From the total charge, it is again possible here to determine the thermal noise, which is caused essentially by the capacitive network 12, and to take it into account for the digital result.

Figure 3:
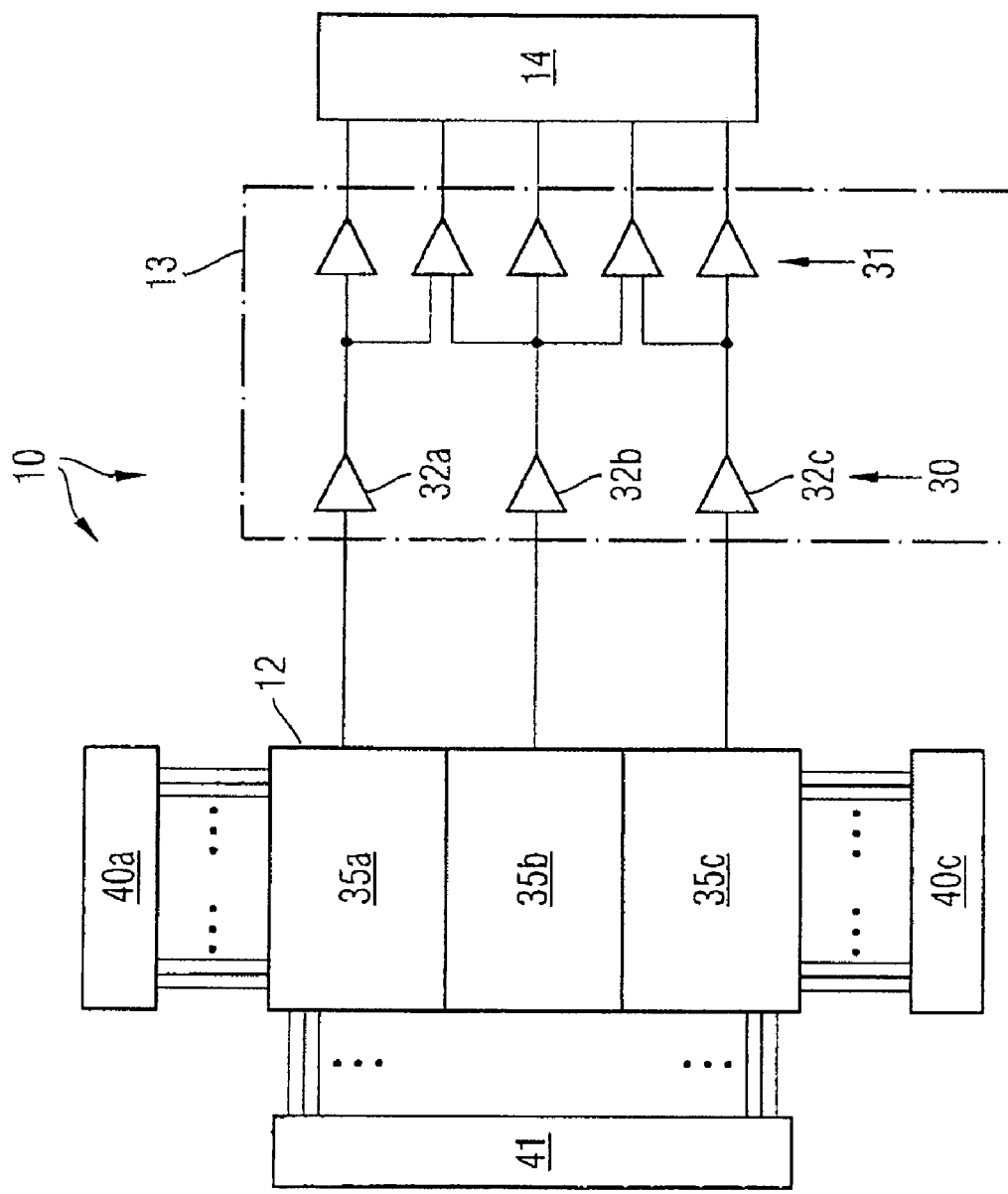
FIG. 3 is an exemplary layout for an inventive A/D converter as shown in FIG. 2.
Figure 4:
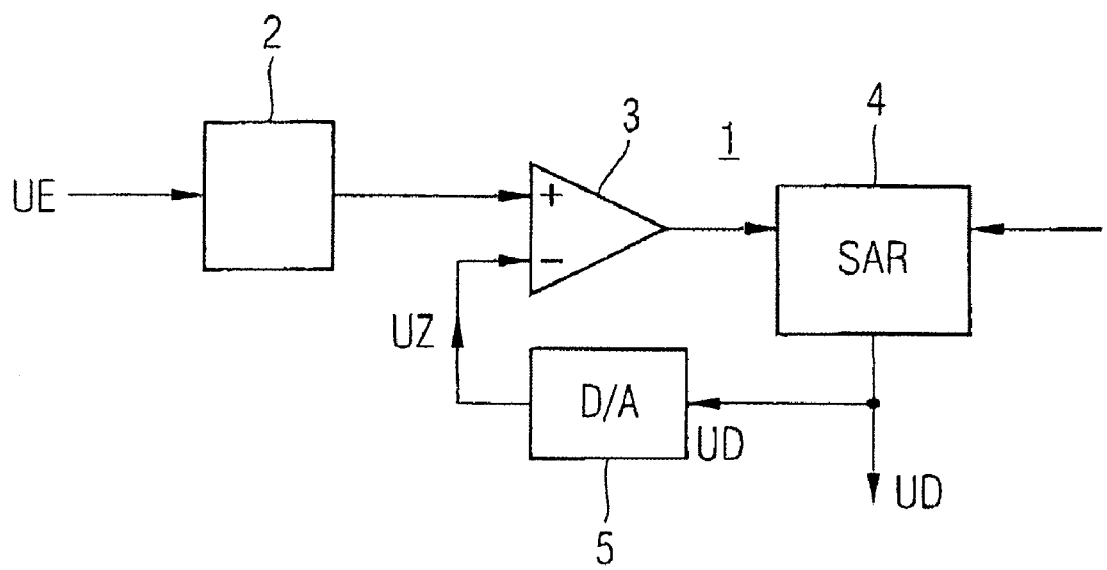
FIG. 4, as discussed above, is a conventional successive approximation A/D converter.
Figure 5:
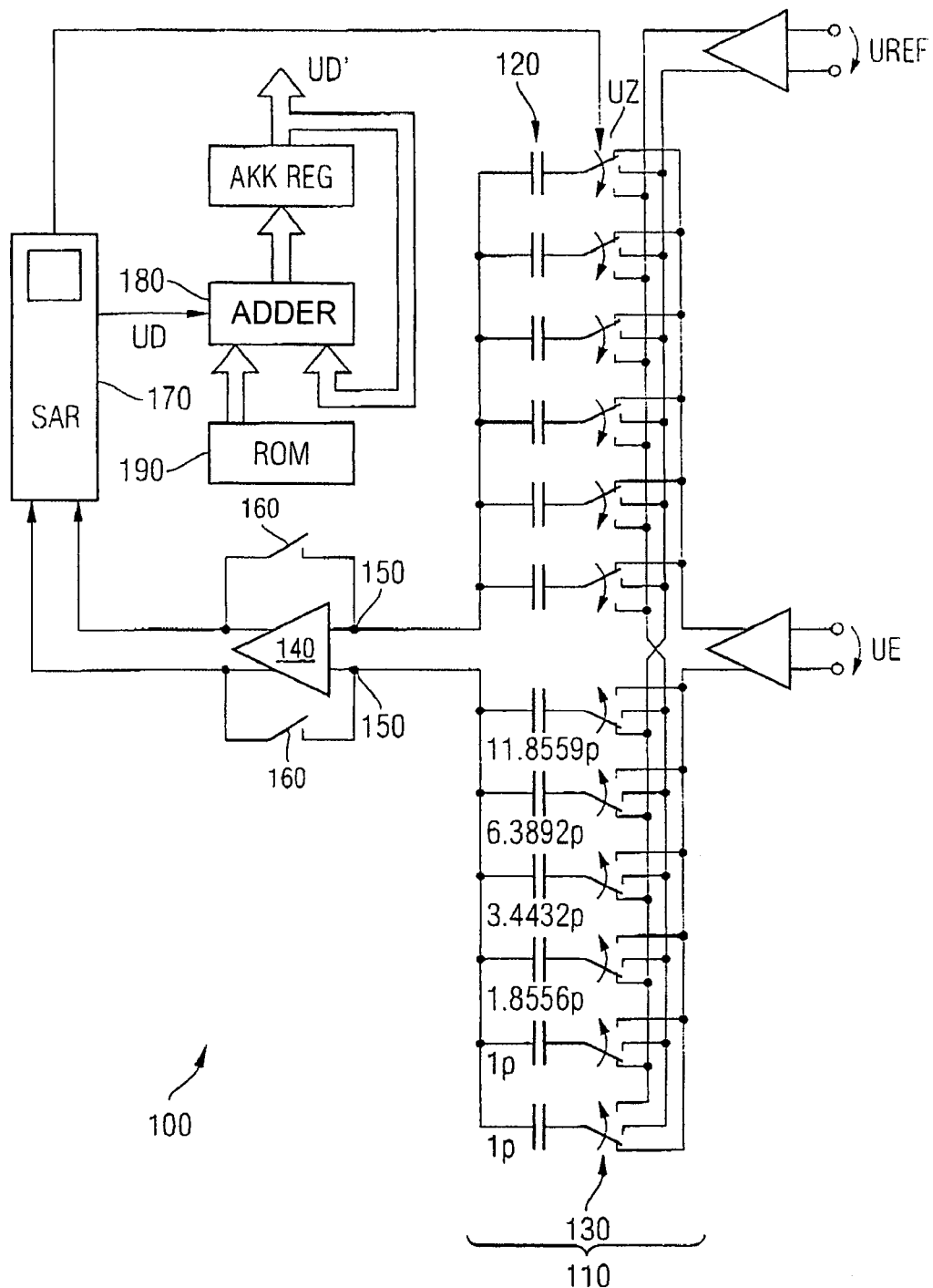
FIG. 5, as discussed above is a further conventional successive approximation A/D converter with a redundant code.

FIG. 3 shows an advantageous layout for an inventive A/D converter with a multistage comparator arrangement which has a capacitive network 12, a comparator arrangement 13 and a downstream logic circuit 14. In this case, in line with FIG. 2, the comparator arrangement 13 is equipped with two comparator stages 30, 31, the first comparator stage 30 having three parallel comparators 32a-32c. In the same way, the capacitive network 12 has three capacitive subnetworks 35a-35c which are respectively associated with one of the comparators 32a-32c in the first comparator stage 30.

It will be assumed that the capacitive network 12 contains a capacitive cell array with, by way of example, 32*32=1024 capacitive cells. In this arrangement, a respective capacitive cell has a switchable capacitance in known fashion, as shown in the capacitive network 12 in FIGS. 1 and 2. A capacitive cell of this kind is selected here in known fashion using the respective row and column decoders, as are also used in memory technology, for example. This column decoder 40 and row decoder 41 can thus be used to select respective individual capacitive cells in the capacitive network 12. In this context, the top capacitive subnetwork 35a can be actuated using a top column decoder 40a and a bottom capacitive subnetwork 35c can be actuated using a bottom column decoder 40c.

One problem, however, is that the central capacitive subnetwork 35b cannot be actuated by a dedicated column decoder for wiring reasons which become apparent from the layout of the integrated circuit. In line with the invention, this central capacitive subnetwork 35b is now actuated using both the top and the bottom column decoder 40a, 40c. The column actuation in this capacitive subnetwork 35b therefore ends in the center of the entire capacitive network 12, which means that in this case the mean value of the column information injected via the two column decoders 40a, 40c is used to actuate this central capacitive subnetwork 35b. This solution has the particular advantage that just two values need to be calculated for actuating the entire capacitive network 12—which would actually need to be actuated using three values—namely the actuation value for the top capacitive network 35a and the actuation value for the bottom capacitive network 35c. This simplification is very advantageous in the practical implementation, because the calculation is not intended to increase the conversion time and should therefore take place one conversion cycle beforehand where possible (pipelining). In this conversion cycle, however, the comparison result from the comparators is not yet known. It is therefore necessary for six respective values to be calculated for the top and the bottom actuation, five of which are respectively rejected again on the basis of the comparator result.

This three way split for the capacitive network 12 is particularly easy to implement in the layout. In this case, the top plate of the capacitive cell array, as described in DE 100 52 944 C1, for example, is simply divided into three parts and the column actuation via the column decoders 40a, 40c is routed to these plates from two sides.

Although the present invention has been described above with reference to a preferred exemplary embodiment, it is not limited thereto but rather can be modified in a wide diversity of ways without departing from the idea of the invention.

In particular, the present invention is not limited to the use of precisely two or three comparators arranged in parallel with one another. Rather, provided that it is possible in terms of circuitry and is considered of use to the application, any number of comparators may be arranged in parallel with one another, so that a corresponding number of thresholds which must contain the input signal can be generated as a result. In the same way, the invention is also not limited to precisely one or two comparator stages. Rather, any number of comparator stages may be used in which an additional number of thresholds can be generated through interpolation if appropriate. In addition, it will also be conceivable to provide no kind of interpolation between the individual comparator stages.

The invention relates particularly to a successive approximation A/D converter having a plurality of comparators which are arranged in one or more comparator stages. What conversion algorithm this A/D converter uses is arbitrary in this context. In particular, a successive approximation A/D converter with redundancy is advantageously suitable, but the invention is not limited thereto. The invention is also not necessarily limited to one specific form of the logic circuit, particularly not to the use of a specific successive approximation register. Rather, it is possible to use an arbitrarily designed logic circuit in this case.

The present patent application has also firstly described an A/D converter of nondifferential design and also an A/D converter of fully differential design. This shows that the invention is not limited to one of these forms.

The present invention has described that at the end of the conversion the total charge of the capacitive network can be read by shorting the inputs of the comparators in the first comparator stage. The same functional effect would be achieved if the outputs of the first stage of the comparators (in the case of FIG. 2) were connected together. In the same way, it would also be conceivable for the digital outputs of the last comparator stage to be logically combined with one another and for the result of this to be used to draw a conclusion about the total charge in the capacitive network by reading the capacitive network. Although the latter option has the drawback that it means that the mismatch in the first comparator stage can influence the accuracy of the A/D converter, it also has the advantage that it is not necessary to connect a high impedance node, as is the case at the output of the capacitive network.

What is claimed is:

1. A successive approximation analog/digital converter converting an analog input signal into a digital output value by means of a plurality of successive conversion cycles, comprising:
    at least one first input for injecting an analog input signal;
    a controllable capacitive network which is connected downstream of the first input and which is divided into at least two capacitive subnetworks;
    at least two parallel-connected and parallel-operating comparators for defining a number of comparator thresholds which number corresponds to the number of parallel comparators; wherein the comparators are respectively connected downstream of one of the capacitive subnetworks and wherein the comparators output a corresponding number of digital intermediate signals on the basis of the comparisons in the comparators;
    a register set by the intermediate signals; wherein the register buffer-stores digital intermediate values for the respective intermediate signals and wherein the register produces control signals for actuating the capacitive subnetworks in response to the content of the intermediate signals; and
    a control circuit which produces a further control signal, which can be used to short circuit at least two of the capacitive subnetworks at the end of an analog/digital conversion and to read out the total electrical charge of the shorted capacitive subnetworks via the comparators.

2. The analog/digital converter of claim 1, comprising at least one first controllable switch which can be used to short circuit the at least two of the capacitive subnetworks and hence the inputs of the relevant comparators.

3. The analog/digital converter of claim 2, wherein the control circuit is operable to actuate the at least one first controllable switch.

4. The analog/digital converter of claim 1, wherein each comparator is designed to compare the analog input signal with a respective comparison signal in order to determine the range defined by the comparator thresholds the analog input signal is within, and on the basis of this to output the digital intermediate signal per comparator and conversion cycle.

5. The analog/digital converter of claim 1, wherein at least one comparator comprises at least one second controllable switch which can be used to bridge its inputs and outputs.

6. The analog/digital converter of claim 1, comprising a multistage comparator arrangement which comprises a first comparator stage comprising at least two comparators which are connected to the capacitive network.

7. The analog/digital converter of claim 6, wherein the comparator arrangement comprises at least one second comparator stage whose comparators have their inputs connected to at least one comparator in the first comparator stage which is respectively connected upstream of the second comparator stage.

8. The analog/digital converter of claim 7, wherein the second comparator stage comprises a larger number of comparators than the respective upstream comparator stage, and the comparators in the second comparator stage are logically combined at least to some extent through interpolation with the comparators in the respective upstream comparator stage.

9. The analog/digital converter of claim 1, wherein the capacitive network comprises a multiplicity of switchable encoded capacitances which can be switched in or out by means of a respective encoded control signal.

10. The analog/digital converter of claim 9, wherein the switchable capacitances in the capacitive network are arranged in a cell array which is divided into three adjacent capacitive subnetworks whose outputs are respectively connected to a comparator, wherein, for the purpose of actuating the three capacitive subnetworks, there are two column or row decoders provided which are respectively connected directly to two of the capacitive subnetworks, the third capacitive subnetwork being able to be actuated by averaging the control signals from the two column or row decoders.

11. The analog/digital converter of claim 1, wherein the register is in the form of a successive approximation register.

12. The analog/digital converter of claim 1, comprising at least one second input for injecting a reference signal.

13. The analog/digital converter of claim 1, wherein the comparator arrangement and the capacitive network are in differential form.

14. The analog/digital converter of claim 1, being in differential form.

15. The analog/digital converter of claim 1, wherein a redundant analog/digital converter is provided.

* * * * *